United States Patent [19]

Yamagata et al.

[11] Patent Number: 4,830,679
[45] Date of Patent: May 16, 1989

[54] HEAT-RESISTANT NI-BASE SINGLE CRYSTAL ALLOY

[75] Inventors: Toshihiro Yamagata; Hiroshi Harada, both of Yokohama; Michio Yamazaki, Zushi, all of Japan

[73] Assignee: National Research Institute for Metals, Tokyo, Japan

[21] Appl. No.: 117,091

[22] Filed: Nov. 5, 1987

[30] Foreign Application Priority Data

Nov. 6, 1986 [JP] Japan ................. 61-262634

[51] Int. Cl.$^4$ ............................................. C22F 1/10
[52] U.S. Cl. ........................................ 148/3; 148/162; 148/404; 148/410
[58] Field of Search ............. 148/404, 410, 3, 162

[56] References Cited

U.S. PATENT DOCUMENTS

| | | | |
|---|---|---|---|
| 4,116,723 | 9/1978 | Gell et al. | 148/3 |
| 4,209,348 | 6/1980 | Duhl et al. | 148/3 |
| 4,643,782 | 2/1987 | Harris et al. | 148/404 |
| 4,707,192 | 11/1987 | Yamazaki et al. | 148/3 |

FOREIGN PATENT DOCUMENTS 89451 6/1982 Japan.
190342 10/1984 Japan.

OTHER PUBLICATIONS

Fredholm et al., Superalloys 1984, pp. 211–220.
Khan et al., Mat. Sci. & Tech., vol. 2, May 1986, pp. 486–492.
Hopgood et al., Mat. Sci. & Tech., vol. 2, Jun. 1986, pp. 543–546.
Miner et al., Metallurgical Transactions A, vol. 17A, Mar. 1986, pp. 491–496.
Harris et al., High Tempt. Alloys for Gas Turbines & Other Applications, 1986, pp. 709–729.
Gell et al., Superalloys 1980, pp. 205–214.
Pearson et al., Superalloys 1980, pp. 513–519.
Nathal et al., Scripta Metallurgica, vol. 17, pp. 1151–1154, 1983.
Caron et al., Mat. Sci. & Eng., 61, pp. 173–184, 1983.
Nathal et al., Superalloys 1984, pp. 125–133.
Khan et al., Superalloys 1984, pp. 145–155.

*Primary Examiner*—R. Dean
*Attorney, Agent, or Firm*—Wenderoth, Lind & Ponack

[57] ABSTRACT

A heat-resistant Ni-base single crystal alloy, suitable as a material for blades and vanes of gas turbines or jet engines, consists of, by weight, 5 to 10% of Co, 5 to 10% of Cr, 9 to 15% of W, 1 to 5% of Mo, 4.5 to 6% of Al, 5 to 10% of Ta, and the balance substantially of Ni with the total proportion of W, Mo and Ta being 17 to 24%, and is produced by directional solidification of a melt of the above-specified composition, followed by solution treatment and aging treatment.

13 Claims, 2 Drawing Sheets

BASE ALLOY
(TMS-25)

ALLOY OF THE
INVENTION
(TMS-26)

(X500)

HEAT-RESISTANT NI-BASE SINGLE CRYSTAL ALLOY

BACKGROUND OF THE INVENTION

1. Field of the Invention

This invention relates to a heat-resistant Ni-base single crystal alloy. More specifically, it relates to a heat-resistant Ni-base single crystal alloy suitable as a material for blades and vanes of gas turbines or high-pressure turbines of jet engines.

2. Description of the Prior Art

The limit temperature for using materials, from which turbine blades and vanes in gas turbines or jet engines are made, is an important factor determining the thermal efficiency of the engines. In particular, the turbine blades require high creep strength because they undergo high centrifugal forces during high-speed rotation.

Conventional Ni-base heat resistant alloys are composed of Al and Ti as elements constituting the gamma prime phase, Co, W, Mo, Ta and Nb as solution strengthening elements, Cr as a corrosion-resistant element and C, B and Zr as grain boundary strengthening elements, and retain high strength at high temperatures by precipitating the gamma prime particles in the Ni matrix phase (gamma phase). With increasing amounts of the gamma prime phase and the solution strengthening elements, the alloys increase in strength, but decrease in ductility.

In order to remove this defect, a directional solidification technique was developed in which a crystal grain boundary perpendicular to the stress axis which is a crack generating source in polycrystals at high temperatures is erased and columnar crystals composed of a bundle of elongate crystals are made. Thereafter, nickel-base alloys in which the columnar crystal grain boundary is strengthened by adding Hf was developed and became commercially available as PWA-1422.

Later, it became known from studies on the heat-treatment of columnar crystals that when the amount of the coarse gamma prime re-dissolved is increased by raising the solution heat-treatment temperature, the amount of fine gamma prime particles precipitated by aging treatment increases, and the creep strength of the resulting alloy increases. But it also became known that since the alloys contain grain boundary strengthening elements which reduce the incipient melting temperature, it is not possible to increase the solution heat-treatment temperature to a temperature high enough to obtain a complete solution of the coarse gamma prime, and there is a limit to the creep strength improvement.

With the foregoing background, single crystal alloys began to be developed which contain grain boundary strengthening elements (Hf, C, B, Zr) in amounts corresponding only to impurities and have an incipient melting temperature higher than the temperature at which all the coarse gamma prime particles dissolve into the gamma phase, and segregation of the elements can be sufficiently removed.

Alloy 444 and Alloy 454 (made by United Technology Inc.; their compositions will be given hereinafter) were developed as the first single crystal alloys. The creep strength of these alloys shows a great increase and their temperature capability increases by about 30° C. from that of the columnar crystal alloy (PWA-1422).

Later, CMSX-2 and CMSX-3 (made by Cannon Muskegon Corporation; their compositions are given hereinafter) were developed. The strengths of these alloys are almost the same as that of Alloy 454. To increase strength, it is necessary to increase the amounts of Co and W. Since, however, precipitation of a detrimental phase occurs, the amount of Co is limited to not more than 7% by weight, and the amount of W, to not more than 8.4% by weight.

SUMMARY OF THE INVENTION

It is an object of this invention to provide a heat-resistant Ni-base single crystal alloy having a higher high-temperature strength than those of the conventional heat-resistant Ni-base single crystal alloys.

The present inventors have made extensive investigations in order to achieve the above object, and consequently found that when Mo is added to a heat-resistant Ni-base single crystal alloy having high Co and W concentrations which has previously been considered as lacking structure stability, an alloy having excellent structure stability, a high high-temperature strength and excellent ductility can be obtained.

Thus, according to this invention, there is provided a heat-resistant Ni-base single crystal alloy consisting of, by weight, 5 to 10% of Co, 5 to 10% of Cr, 9 to 15% of W, 1 to 5% of Mo, 4.5 to 6% of Al, 5 to 10% of Ta, and the balance substantially of Ni with the total proportion of W, Mo and Ta being 17 to 24%, said alloy being obtained by directional solidification followed by solution treatment and aging treatment of the resulting single crystal.

BRIEF DESCRIPTION OF THE ACCOMPANYING DRAWINGS

DETAILED DESCRIPTION OF THE INVENTION

Figure 1:
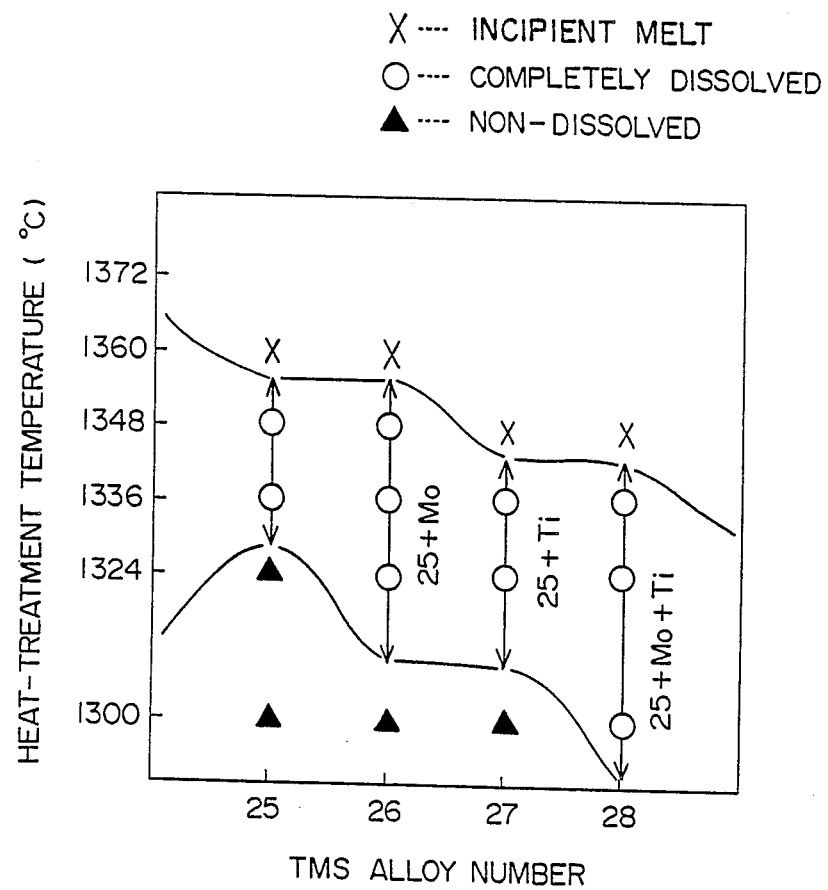
FIG. 1 shows the results of observing the structures of an alloy of the invention and alloys for comparison after heat-treatment at 1300° to 1360° C. for 4 hours.
Figure 2:
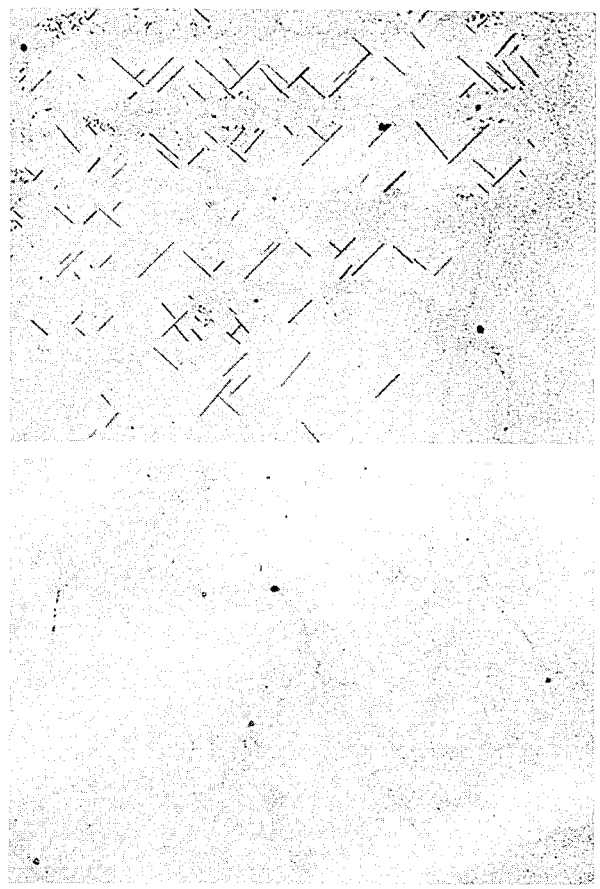
FIG. 2 show microphotographs (500×) of the alloy of the invention and the base alloy (TMS-25) after heat-treatment at 1336° C. for 4 hours.

The individual components of the alloy of the invention have the following actions. The proportions of these components and the heat-treatment conditions for the alloy are limited for the following reasons.

Co dissolves in the gamma phase and the gamma prime phase to strengthen these phases. Particularly, it has the ability to increase the strength of the alloy at low temperatures. If its amount is less than 5% by weight (all percentages hereinafter are by weight), sufficient strength cannot be obtained. If it exceeds 10%, detrimental phases such as a sigma phase form, and the creep rupture strength of the alloy decreases in the entire temperature range. Hence, the proportion of Co should be within the range of 5 to 10%, and the preferred range is 7.8 to 8.6%.

Cr acts to improve the hot corrosion resistance of the alloy. If its amount is less than 5%, its action is not sufficient. If it exceeds 10%, detrimental phases such as a sigma phase or a mu phase form to reduce creep rupture strength. Hence, the proportion of Cr should be 5 to 10%. The preferred range is 5.3 to 5.9%.

W dissolves in the gamma phase and the gamma prime phase to strengthen these phases. To obtain sufficient solution strengthening, it should be used in an amount of at least 9%. If its proportion exceeds 15%, detrimental phases such as a mu phase and an alpha-W phase form to reduce creep rupture strength. Hence, the proportion of W should be 9 to 15%. The preferred range is 10.5 to 11.3%.

Mo dissolves in the gamma phase and the gamma prime phase to strengthen these phases and at the same time, extinguishes the mu phase which forms in an alloy containing more than 9% of W and more than 5% of Co, and stabilizes the structure of the alloy. If its proportion is less than 1%, its ability to extinguish the mu phase is not sufficient. If its proportion exceeds 5%, this ability is lost and a mu phase forms to reduce the creep rupture strength of the alloy. Hence, the proportion of Mo should be 1 to 5%. The preferred range is 1.7 to 2.1%.

Al is an element necessary for forming the gamma prime phase. To precipitate the gamma prime phase sufficiently, it should be included in an amount of at least 4.5%. If, however, its proportion exceeds 6%, the amount of a eutectic gamma prime becomes so large that the solution treatment becomes impossible. Consequently, the creep rupture strength of the alloy is reduced. Hence, the proportion of Al should be 4.5 to 6%. The preferred range is 4.9 to 5.3%.

Ta is an element necessary for strengthening the gamma prime phase by dissolution and increasing the amount of the gamma prime phase. If its proportion is less than 5%, solution strengthening is little and the amount of the gamma prime phase is small. Hence, no sufficient strength can be obtained. If its amount exceeds 10%, the amount of the eutectic gamma prime becomes too large, and the solution treatment cannot be carried out sufficiently. Consequently, the creep rupture strength of the alloy is reduced. Hence, the proportion of Ta should be 5 to 10%. The preferred range is 7.2 to 8.2%.

To obtain excellent creep rupture strength with the alloy of this invention, the total proportion of W, Mo and Ta, which are effective for solution strengthening of the gamma phase or the gamma prime phase, should be 17 to 24%. If this total proportion is less than 17%, solid solution strengthening is insufficient, and no sufficient creep rupture strength can be obtained. If the total proportion exceeds 24%, detrimental phases such as an alpha-W phase or a mu phase form to reduce the creep rupture strength of the alloy. The preferred range of the total proportion is 19.4 to 21.6%.

A material having the above-specified composition is solidified directionally to form a single crystal.

To dissolve the gamma prime phase and the eutectic gamma prime region present in the single crystal in the gamma phase which is a matrix phase, the single crystal is subjected to solution treatment by heating it at high temperatures. If the solution treatment temperature is lower than 1315° C., the gamma prime particles and the eutectic gamma prime region cannot be completely dissolved. Hence, the subsequent aging treatment cannot provide a structure in which the fine gamma prime particles are uniformly precipitated and dispersed. Consequently, no sufficient creep rupture strength can be obtained. If the solution treatment temperature exceeds 1350° C., incipient melting tends to occur and the creep rupture strength of the alloy is drastically reduced. Hence, the solution treatment is carried out preferably at a temperature of 1315° to 1350° C. If the heating time is long, the segregation in the alloy is reduced, and the alloy has a homogeneous composition and increased creep rupture strength. Hence, longer periods of time are preferred. The particularly preferred heating time is 3 to 5 hours.

After the solution treatment, the alloy should be cooled rapidly to below 760° C. If the cooling rate is low, the gamma prime particles precipitate and increase in size during cooling, and a finely precipitated structure cannot be obtained in the subsequent aging treatment. Desirably, the alloy is cooled to 760° C. within 3 minutes.

After rapid cooling, the alloy is subjected to the aging treatment. This treatment is carried out in order to obtain a finely precipitated structure. In this treatment, the alloy is heated at 800° to 1100° C. If the temperature is lower than 800° C., a long period of time is required to precipitate the gamma prime phase fully. This is disadvantageous to alloy production. If the temperature exceeds 1100° C., the precipitated gamma prime phase markedly increases in size, and the creep rupture strength of the alloy is reduced. Preferably, therefore, the aging treatment is carried out at a temperature of 800° to 1100° C. To precipitate the gamma prime particles finely in sufficient amounts, the aging treatment time is desirably 3 to 48 hours. When the treating temperature is relatively high, for example 950° to 1100° C., the treating time is preferably within 8 hours in order to prevent extreme size increase in the gamma prime particles. At lower temperatures, the treating time is desirably more than 8 hours. The aging treatment may be carried out by combining a treatment at relatively high temperatures and a treatment at relatively low temperatures.

EXAMPLES

Single crystals of the alloy of the invention and the comparative alloys shown in Table 1 were produced by directional solidification. About 3 kg of raw materials were melted in a high-frequency vacuum induction melting furnace, heated to about 1500° C., and poured into a single crystal mold separately heated by a graphite heater on a water-cooled copper plate. The single crystal mold was formed by the lost wax method, and consisted of a starter block, a selector, a test piece and a head arranged in this order from below (on the side of the water-cooled copper plate). By drawing the mold downwardly of the heater at a speed of 200 mm/hour, the molten metal in the mold was solidified in one direction upwardly from the water-cooled copper plate. Only one crystal was selected in the selector and the test piece was formed into a single crystal.

The resulting single crystals was first maintained at 1250° C., then heated to a temperature between 1300° and 1360° C. at a rate of 1° C. per minute, kept for 4 hours at that temperature, air-cooled, and then observed in order to determine the temperature range (window) within which the solidified structure could be formed into a solid solution.

The structure of the resulting sample was observed, and the results are shown in FIG. 1.

The window of TMS-25, the base alloy for the alloy of this invention, is as narrow as 20° C. from 1330° to 1350° C. With TMS-26 which is the alloy of this invention obtained by adding Mo to the base alloy, the solvus temperature of the gamma prime decreases and its window was as wide as 35° C. from 1315° to 1350° C.

With TMS-27 alloy obtained by adding Ti to TMS-25, the solvus temperature of gamma prime decreases. But since its incipient melting temperature also decreases, the window of TMS-27 is narrower than that of the alloy of this invention (TMS-26). With TMS-28, an alloy obtained by further adding Mo to TMS-27, the solvus temperature of gamma prime further decreases, and the window of TMS-28 was widened to a lower temperature.

The foregoing results show that the addition of Mo to a base alloy having higher Co and W concentrations than the conventional alloys has an effect of widening the window. The window of the alloy of the invention is sufficiently broader than those of the conventional alloys and is very advantageous in practical application.

Since the temperature range of the window is 1315° to 1350° C. which is higher than those of the conventional alloys, it is easy to remove segregation of constituent elements, and the uniformity and stability of precipitation and dispersion of the gamma prime particles increase.

During the solution treatment of the solidified structure, precipitation of an acicular mu phase was observed in the base alloy in addition to the formation of the gamma prime phase and the eutectic gamma prime region into complete solutions. In the alloys to which Mo and Ti were added, no precipitation of the mu phase was observed. This fact also shows that the addition of Mo and Ti to the alloys having higher Co and W concentrations than the conventional alloys greatly increases the stability of the structure.

A single crystal test piece having a diameter of 6 mm at its gauge portion, a length of 30 mm, and a total length of 70 mm was prepared from the single crystal of each of the alloys, and subjected to solution treatment and aging treatment under the heat-treating conditions shown in Table 2. The treated sample was subjected to a creep ruptue test at 800° C. and 75 kgf/mm$^2$, and at 1040° C. and 14 kgf/mm$^2$, respectively. The results are shown in Table 2.

The addition of Mo to the base alloy (TMS-25) increased the rupture life of the resulting alloy (TMS-26) both at 800° C. and at 1040° C. The increase was particularly marked at the higher temperature.

When Ti was added to the base alloy (TMS-25), the rupture life of the resulting alloy (TMS-27) increased at 1040° C. but decreased at 800° C. When Mo was further added to TMS-27, the rupture life of the resulting alloy (TMS-28) increased at both of the above temperatures, and approached that of TMS-28. However, the rupture elongation of this alloy was lower than that of TMS-26, and particularly its rupture elongation at 1040° C. decreased to one-third of that of TMS-26.

The high-temperature strengths of the alloy of this invention (TMS-26) and the comparative alloys are shown in Table 2 in terms of temperatures at which they withstand a stress of 75 kgf/mm$^2$ for 200 hours and temperatures at which they withstand a stress of 14 kgf/mm$^2$ for 1000 hours.

By the addition of Mo to the base alloy (TMS-25), the withstanding temperature of the resulting alloy (TMS-26) increased by 5° C. under 75 kgf/mm$^2$ and by 27° C. under 14 kgf/mm$^2$.

The alloy of this invention showed about three times as high a rupture life and rupture elongation at 800° C. and 75 kgf/mm$^2$ as the conventional alloys, and at 1040° C. and 14 kgf/mm$^2$, showed at least three times as long a rupture life and two times as high a rupture elongation as the conventional alloys.

The withstanding temperature of the alloy of the invention at which it could withstand a stress of 75 kgf/mm$^2$ for 200 hours increased by 23° C. from those of the conventional alloys, and the withstanding temperature of the alloy of the invention at which it could withstand a stress of 14 kgf/mm$^2$ for 1000 hours increased by 31° to 37° C. from those of the conventional alloys.

In a heat-resistant Ni-base alloy having high Co and W concentrations which are avoided in the conventional alloys because of the precipitation of detrimental phases such as a mu phase and an alpha-W phase, the addition of Mo stabilized the structure of the alloy, broadened the heat-treatment window, and gave superior high-temperature properties such as strength and ductility over a wide temperature range from a high to a low temperature compared to the conventional alloys.

TABLE 1

| Alloy designation | | Alloy composition (wt. %) balance Ni | | | | | | | |
|---|---|---|---|---|---|---|---|---|---|
| | | Co | Cr | Mo | W | Al | Ti | Ta | Others |
| Example | TMS-26 | 8.2 | 5.6 | 1.9 | 10.9 | 5.1 | 0 | 7.7 | |
| Comparative alloys | TMS-25 | 7.9 | 5.5 | 0 | 12.9 | 5.2 | 0 | 7.6 | |
| | TMS-27 | 8.1 | 5.9 | 0 | 12.9 | 4.9 | 0.9 | 6.0 | |
| | TMS-28 | 8.4 | 5.8 | 1.9 | 11.0 | 4.9 | 0.9 | 6.0 | |
| Conventional alloys | Alloy 444 | 0 | 5–8 | ≦10 | ≦15 | 2–8 | 1–5 | ≦12 | Re ≦ 7, Nb ≦ 3, Hf ≦ 3.5 Al + Ti ≧ 5 Mo + W + Ta + Nb + Hf ≧ 25 Co, C, B, Zr impurities |
| | Alloy 454 | 3–7 | 8–12 | 0 | 3–5 | 4.5–5.5 | 1–2 | 10–14 | Ta > 11, Cr > 9 W + Ta > 15.5 |
| | CMSX-2 | 4.3–4.9 | 7.5–8.2 | 0.3–0.7 | 7.6–8.4 | 5.45–5.75 | 0.8–1.2 | 5.8–6.2 | — |
| | CMSX-3 | 4.3–4.9 | 7.5–8.2 | 0.3–0.7 | 7.6–8.4 | 5.45–5.75 | 0.8–1.2 | 5.8–6.2 | Hf 0.05–0.10 |

TABLE 2

| Alloy designation | | Solution formable temperature range (window) (°C.) | Creep rupture characteristics | | | | Temperature capability | | Heat-treatment conditions |
|---|---|---|---|---|---|---|---|---|---|
| | | | 800° C., 75 kgf/mm$^2$ | | 1040° C., 14 kgf/mm$^2$ | | | | |
| | | | Life (hrs.) | Elongation (%) | Life (hrs.) | Elongation (%) | 75 kgf/mm$^2$ 200 hrs. | 14 kgf/mm$^2$ 1000 hrs. | |
| Example | TMS-26 | 1315–1350 | 345 | 26.3 | 1775 | 21.3 | 811 | 1054 | A |
| Comparative alloys | TMS-25 | 1330–1350 | 271 | 25.2 | 599 | 24.0 | 806 | 1027 | A |
| | TMS-27 | 1315–1340 | 181 | 20.7 | 741 | 16.8 | 798 | 1032 | B |
| | TMS-28 | 1300–1340 | 334 | 21.7 | 1339 | 7.3 | 811 | 1047 | B |

TABLE 2-continued

| | Alloy designation | Solution formable temperature range (window) (°C.) | Creep rupture characteristics | | | | Temperature capability | | Heat-treatment conditions |
|---|---|---|---|---|---|---|---|---|---|
| | | | 800° C., 75 kgf/mm² | | 1040° C., 14 kgf/mm² | | 75 kgf/mm² 200 hrs. | 14 kgf/mm² 1000 hrs. | |
| | | | Life (hrs.) | Elongation (%) | Life (hrs.) | Elongation (%) | | | |
| Conventional alloys | Alloy 444 | 1279–1302 | 115 | | 400 | | 788 | 1017 | C |
| | Alloy 454 | 1288–1316 | 115 | 9 | 440 | 12 | 788 | 1019 | C |
| | CMSX-2 | 1307–1332 | 118 | | 400 | | 788 | 1017 | D |
| | CMSX-3 | 1288–1316 | 118 | | 525 | | 788 | 1023 | E |

(NOTE)

Heat-treatment conditions

Solution treatment
A: 1342° C. × 4 hrs. air cooling → 982° C. × 5 hrs.
B: 1330° C. × 4 hrs. air cooling → 982° C. × 5 hrs.
C: 1288° C. × 4 hrs. air cooling → 1079° C. × 4 hrs.
D: 1316° C. × 3 hrs. air cooling → 982° C. × 5 hrs.
E: 1302° C. × 3 hrs. air cooling → 982° C. × 5 hrs.

Aging treatment
air cooling → 870° C. × 20 hrs. air cooling
air cooling → 870° C. × 20 hrs. air cooling
air cooling → 871° C. × 32 hrs. air cooling
air cooling → 871° C. × 20 hrs. air cooling
air cooling → 871° C. × 20 hrs. air cooling The alloy of the invention has a wider heat-treatment window than conventional heat-resistant Ni-based single crystal alloys. The heat-treatment temperature is so high as to permit easy elimination of segregation of the alloy components incident to solidification. Furthermore, the alloy of the invention has superior strength and ductility properties over a wide temperature range from a high to a low temperature compared to the conventional Ni-based single crystal alloys. Accordingly, the use of a single crystal blade made of this alloy can increase the gas inlet temperature of a high-pressure turbine in a jet engine and increase the efficiency of the engine.

What is claimed is:

1. A heat-resistant Ni-base single crystal alloy consisting of, by weight, 5 to 10% of Co, 5 to 10% of Cr, 9 to 15% of W, 1 to 5% of Mo, 4.5 to 6% of Al, 5 to 10% of Ta, and the balance substantially of Ni with the total proportion of W, Mo and Ta being 17 to 24%, said alloy being obtained by directional solidification followed by solution treatment, rapid cooling to a temperature of 760° C. or below within 3 minutes and aging treatment of the resulting single crystal.

2. The alloy of claim 1 wherein the proportion of Co is 7.8 to 8.6%.

3. The alloy of claim 1 wherein the proportion of Cr is 5.3 to 5.9%.

4. The alloy of claim 1 wherein the proportion of W is 10.5 to 11.3%.

5. The alloy of claim 1 wherein the proportion of Mo is 1.7 to 2.1%.

6. The alloy of claim 1 wherein the proportion of Al is 4.9 to 5.3%.

7. The alloy of claim 1 wherein the proportion of Ta is 7.2 to 8.2%.

8. The alloy of claim 1 wherein the total proportion of W, Mo and Ta is 19.4 to 21.6%.

9. The alloy of claim 1 which is composed of 8.2% of Co, 5.6% of Cr, 1.9% of Mo, 10.9% of W, 5.1% of Al, 7.7% of Ta and the balance being Ni.

10. A process for producing a heat-resistant Ni-base single crystal alloy, which comprises solidifying a molten metal composition composed of, by weight, 5 to 10% of Co, 5 to 10% of Cr, 9 to 15% of W, 1 to 5% of Mo, 4.5 to 6% of Al, 5 to 10% of Ta, and the balance substantially of Ni with the total proportion of W, Mo and Ta being 17 to 24% directionally to form a single cyrstal, and subjecting the resulting single crystal to solution treatment, rapid cooling to a temperature of 760° C. or below within 3 minutes and aging treatment.

11. The process of claim 10 wherein the solution treatment is carried out by heating the single crystal at 1,315° to 1,350° C. for 3 to 5 hours to convert the solidified structure completely into a solid solution.

12. The process of claim 10 wherein the aging treatment is carried out by heating the single crystal subjected to the solution treatment and rapidly cooled, at a temperature of 800° to 1100° C. for 3 to 48 hours.

13. A turbine blade made of a heat-resistant Ni-base single crystal alloy consisting of, by weight, 5 to 10% of Co, 5 to 10% of Cr, 9 to 15% of W, 1 to 5% of Mo, 4.5 to 6% of Al, 5 to 10% of Ta, and the balance substantially of Ni with the total proportion of W, Mo and Ta being 17 to 24%, said alloy being obtained by directional solidification followed by solution treatment, rapid cooling to a temperature of 760° C. or below within 3 minutes and aging treatment of the resulting crystal.

* * * * *

UNITED STATES PATENT AND TRADEMARK OFFICE
CERTIFICATE OF CORRECTION

PATENT NO. : 4,830,679
DATED : May 16, 1989
INVENTOR(S) : Toshihiro YAMAGATA et al.

It is certified that error appears in the above-identified patent and that said Letters Patent is hereby corrected as shown below:

Column 6, line 4, change "TMS-28" to --TMS-26--.

In the NOTE below TABLE 2-continued in columns 7-8, change the description of the Heat-treatment conditions to -- Heat-treatment conditions Solution treatment                                   Aging treatment A: 1342°C. X 4 hrs. air cooling → 982°C. X 5 hrs. air cooling → 870°C. X 20 hrs. air cooling B: 1330°C. X 4 hrs. air cooling → 982°C. X 5 hrs. air cooling → 870°C. X 20 hrs. air cooling C: 1288°C. X 4 hrs. air cooling → 1079°C. X 4 hrs. air cooling → 871°C. X 32 hrs. air cooling D: 1316°C. X 3 hrs. air cooling → 982°C. X 5 hrs. air cooling → 871°C. X 20 hrs. air cooling E: 1302°C. X 3 hrs. air cooling → 982°C. X 5 hrs. air cooling → 871°C. X 20 hrs. air cooling --.

Signed and Sealed this

Third Day of April, 1990

*Attest:*

HARRY F. MANBECK, JR.

*Attesting Officer*        *Commissioner of Patents and Trademarks*